US012660094B2

(12) United States Patent
Samsudin et al.

(10) Patent No.: US 12,660,094 B2
(45) Date of Patent: Jun. 16, 2026

(54) METHOD AND APPARATUS FOR STACKING PRINTED CIRCUIT BOARD ASSEMBLIES WITH SINGLE REFLOW

(71) Applicant: Jabil Inc., St. Petersburg, FL (US)

(72) Inventors: Zambri Bin Samsudin, Penang (MY); Idris Bin Mansor, Penang (MY)

(73) Assignee: Jabil Inc., St. Petersburg, FL (US)

( * ) Notice: Subject to any disclaimer, the term of this patent is extended or adjusted under 35 U.S.C. 154(b) by 399 days.

(21) Appl. No.: 18/245,024

(22) PCT Filed: Sep. 13, 2021

(86) PCT No.: PCT/US2021/050011
§ 371 (c)(1),
(2) Date: Mar. 13, 2023

(87) PCT Pub. No.: WO2022/060654
PCT Pub. Date: Mar. 24, 2022

(65) Prior Publication Data
US 2023/0363094 A1 Nov. 9, 2023

Related U.S. Application Data

(60) Provisional application No. 63/078,490, filed on Sep. 15, 2020.

(51) Int. Cl.
| | |
|---|---|
| *H05K 3/341* | (2026.01) |
| *H05K 3/12* | (2006.01) |
| *H05K 3/3494* | (2026.01) |
| *H05K 13/08* | (2006.01) |

(52) U.S. Cl.
CPC .......... *H05K 3/341* (2013.01); *H05K 3/1225* (2013.01); *H05K 3/3494* (2013.01); *H05K 13/085* (2018.08)

(58) Field of Classification Search
CPC .... H05K 3/341; H05K 3/3494; H05K 13/085; H05K 3/0097; H05K 3/0052; H05K 3/3485; H05K 3/368; H05K 2203/163; H05K 1/141; H05K 1/144; H05K 2201/041; H05K 2201/042; H05K 2201/0909;

(Continued)

(56) References Cited

U.S. PATENT DOCUMENTS

| | | | |
|---|---|---|---|
| 5,869,353 A * | 2/1999 | Levy ...................... | H05K 1/182 |
| | | | 257/E21.705 |
| 6,697,261 B2 * | 2/2004 | Matsuda ................. | H01L 23/13 |
| | | | 174/253 |

(Continued)

FOREIGN PATENT DOCUMENTS

| | | |
|---|---|---|
| CN | 103281825 A | 9/2013 |
| KR | 10-2006-0116419 A | 11/2006 |

OTHER PUBLICATIONS

Office Action with English translation issued in corresponding CN Application No. 202180075538.7, dated Jul. 26, 2025.

*Primary Examiner* — Donghai D Nguyen
(74) *Attorney, Agent, or Firm* — Young Basile Hanlon & MacFarlane, P.C.

(57) ABSTRACT

Disclosed herein are implementations of methods and devices for stacking printed circuit board (PCB) assemblies (PCBA) with a single reflow process which decreases impact on surface mount technology (SMT) component and solder joint reliability.

15 Claims, 8 Drawing Sheets

(58) Field of Classification Search
       CPC ........... Y10T 29/4913; Y10T 29/49131; Y10T
                                   29/49141; Y10T 29/49789
       See application file for complete search history.

(56)                        References Cited

U.S. PATENT DOCUMENTS 7,316,060  B2 *    1/2008   Kledzik ................... H01L 25/18
                                                                257/E25.023
      9,287,235  B2       3/2016   Sweere
      9,601,461  B2       3/2017   Ho et al.
   2003/0060172  A1       3/2003   Kuriyama et al.
   2008/0195817  A1       8/2008   Hiew et al.
   2009/0289101  A1 *   11/2009   Du ........................ H05K 3/3436
                                                                  228/178
   2014/0251668  A1 *    9/2014   Chuang .................. H05K 3/305
                                                                   29/832
   2014/0263585  A1       9/2014   Sweere
   2020/0367367  A1 *   11/2020   Samsudin ............ H05K 3/3421

* cited by examiner

_200_

Bottom PCB Panel

_220_

Middle PCB Panel

_220_

_200_

Middle PCB Panel on top of
The Bottom PCB Panel

_240_

_220_

_200_

Top PCB Panel on top of
The Middle PCB Panel

_710_

_725_

Motherboards

_710_

_715_

_705_

_730_

_740_

_700_

_750_

METHOD AND APPARATUS FOR STACKING PRINTED CIRCUIT BOARD ASSEMBLIES WITH SINGLE REFLOW

CROSS-REFERENCE TO RELATED APPLICATION(S)

This application is a national stage entry of International Patent Application Serial No. PCT/US2021/050011, filed Sep. 13, 2021, which claims priority to U.S. Provisional Application Ser. No. 63/078,490, filed Sep. 15, 2020, the entire disclosures of which are incorporated herein.

TECHNICAL FIELD

This disclosure relates to electronics and electronics assembly processing.

BACKGROUND

Stacking of printed circuit board assemblies (PCBAs) on a mother or main board suffers from multiple issues. The PCBAs (which are also known as the daughter boards) may be assembled offline. This incurs longer cycle-times. The offline assembled PCBAs are then later treated as a surface mount technology (SMT) component during the main board assembly process. That is, the PCBAs are subjected to multiple thermal excursions (depending on the stack count) for each reflow process of the main board assembly process. Designers must therefore select components that can stand multiple heat excursions due to multiple reflow processes. In addition, the multiple reflow processes may weaken joint bonds including mechanical and electrical connectivity. Alternatively, single reflow process can be abducted by depositing the solder paste on the daughter board via a jetting process. This process not only requires a massive capital investment on a jetting machine, but the constraint on the deposition size is limited to a 0.5 mm dot size (standard option) and a 0.3 mm dot size (special option), making this method unsuitable for packages smaller then a 0201 package size (which is a pad size of 0.3 mm×0.38 mm).

SUMMARY

Disclosed herein are implementations of methods and devices for stacking printed circuit board assemblies with a single reflow process. This decreases impact on surface mount technology (SMT) component and solder joint reliability. In addition, the processes are suitable for packages smaller than the 0201-package size.

BRIEF DESCRIPTION OF THE DRAWINGS

The disclosure is best understood from the following detailed description when read in conjunction with the accompanying drawings and are incorporated into and thus constitute a part of this specification. It is emphasized that, according to common practice, the various features of the drawings are not to-scale. On the contrary, the dimensions of the various features are arbitrarily expanded or reduced for clarity.

DETAILED DESCRIPTION

Figures 1A, 1B, 1C, 1D:
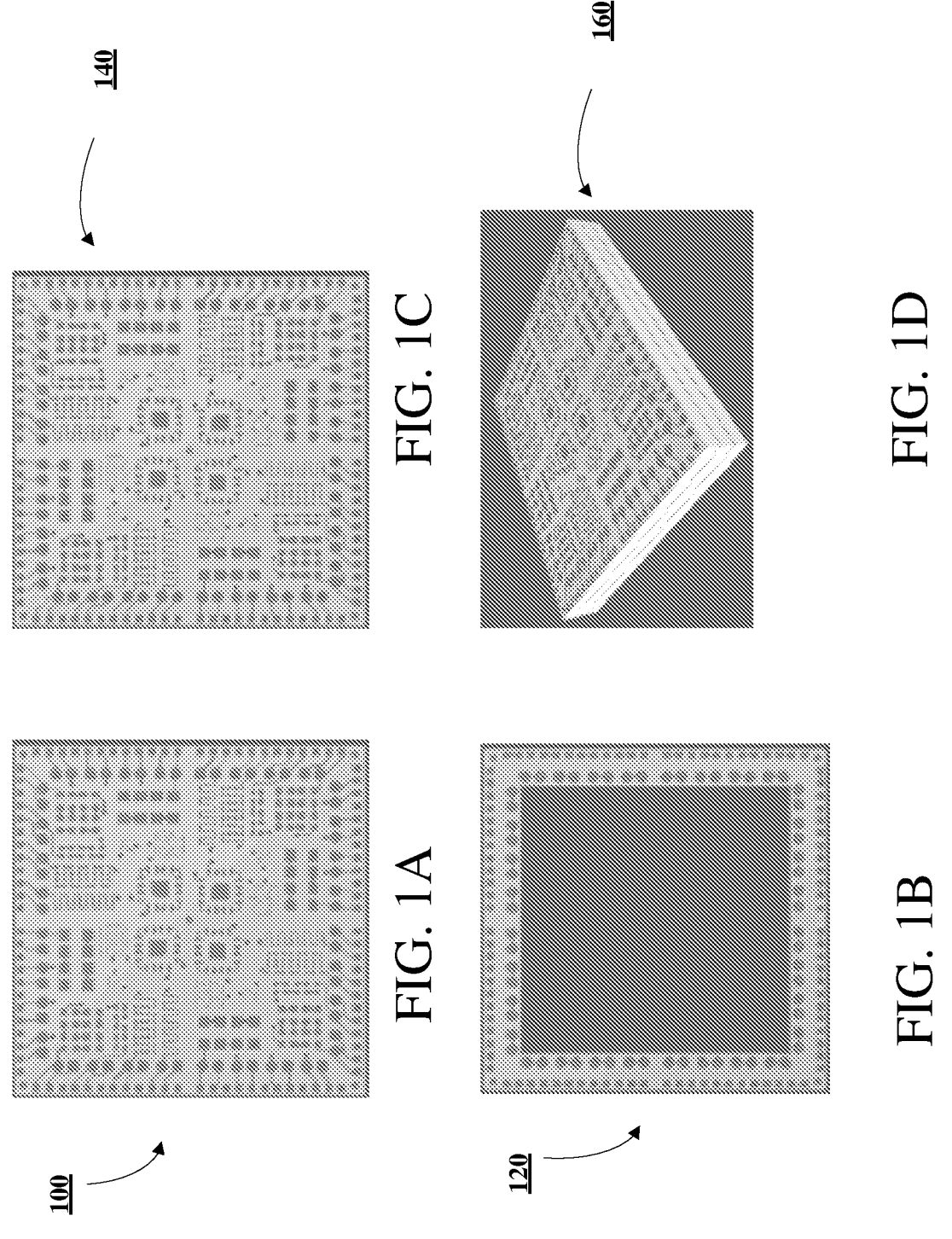
FIGS. 1A-D are photographs of a bottom printed circuit board (PCB), a middle PCB, a top PCB, and a stacked assembly in accordance with certain implementations.
Figure 2A:
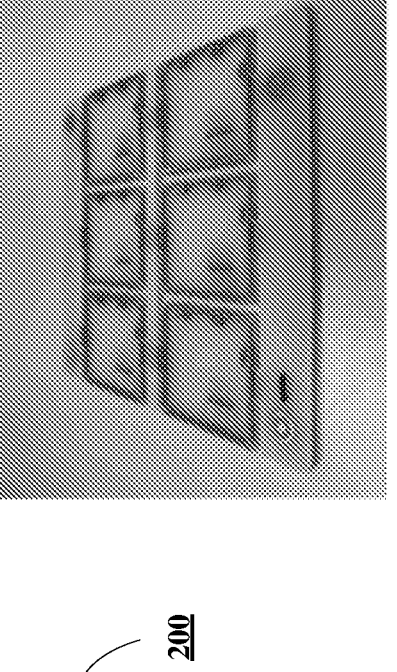
FIGS. 2A-D are example photographs of a bottom PCB panel, a middle PCB panel, the middle PCB panel stacked on the bottom PCB, a top PCB panel stacked on the middle PCB panel in accordance with certain implementations.
Figure 2B:
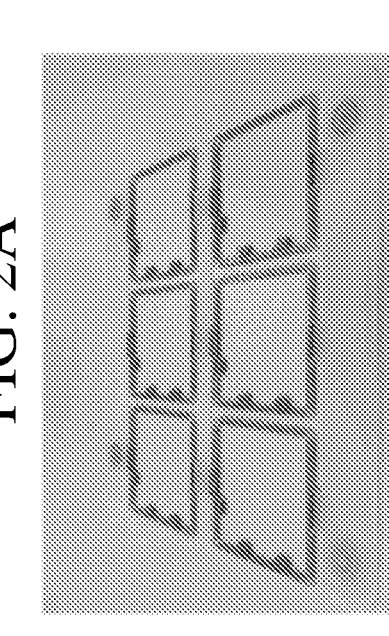
Figure 2C:
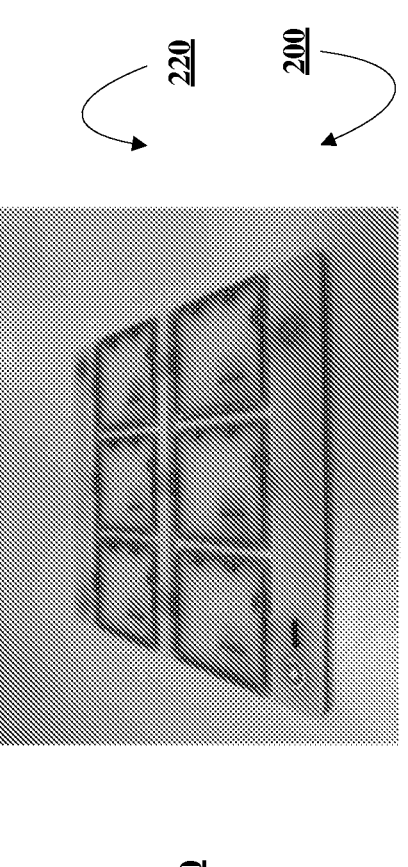
Figure 2D:
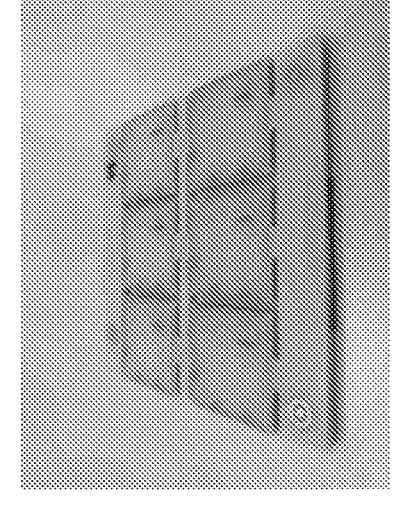
Figure 2D:

The figures and descriptions provided herein may be simplified to illustrate aspects of the described embodiments that are relevant for a clear understanding of the herein disclosed processes, machines, manufactures, and/or compositions of matter, while eliminating for the purpose of clarity other aspects that may be found in typical similar devices, systems, compositions and methods. Those of ordinary skill may thus recognize that other elements and/or steps may be desirable or necessary to implement the devices, systems, compositions and methods described herein. However, because such elements and steps are well known in the art, and because they do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

Embodiments are provided throughout so that this disclosure is sufficiently thorough and fully conveys the scope of the disclosed embodiments to those who are skilled in the art. Numerous specific details are set forth, such as examples of specific aspects, devices, and methods, to provide a thorough understanding of embodiments of the present disclosure. Nevertheless, it will be apparent to those skilled in the art that certain specific disclosed details need not be employed, and that embodiments may be embodied in different forms. As such, the exemplary embodiments set forth should not be construed to limit the scope of the disclosure.

The terminology used herein is for the purpose of describing particular embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, steps, operations, elements, and/or components, but do not preclude the presence or addition of one or more other features, steps, operations, elements, components, and/or groups thereof.

The steps, processes, and operations described herein are thus not to be construed as necessarily requiring their respective performance in the particular order discussed or illustrated, unless specifically identified as a preferred or required order of performance. It is also to be understood that additional or alternative steps may be employed, in place of or in conjunction with the disclosed aspects.

Yet further, although the terms first, second, third, etc. may be used herein to describe various elements, steps or aspects, these elements, steps or aspects should not be limited by these terms. These terms may be only used to distinguish one element or aspect from another. Thus, terms such as "first," "second," and other numerical terms when used herein do not imply a sequence or order unless clearly indicated by the context. Thus, a first element, step, component, region, layer or section discussed below could be termed a second element, step, component, region, layer or section without departing from the teachings of the disclosure.

The non-limiting embodiments described herein are with respect to a method for printed circuit board (PCB) assembly (PCBA) stacking with a single reflow. The method for PCBA stacking with a single reflow may be modified for a variety of applications and uses while remaining within the spirit and scope of the claims. The embodiments and variations described herein, and/or shown in the drawings, are presented by way of example only and are not limiting as to the scope and spirit. The descriptions herein may be applicable to all embodiments of the method for PCBA stacking in a single reflow.

Described herein is a method for PCBA stacking with a single reflow. In an implementation, the method for PCBA stacking with a single reflow includes placing all applicable PCBs onto a pick and place pallet, print the solder paste, then flow it through into the pick and placement machine as opposed to placing the daughter board PCB at the feeder bank and pick and place it onto the motherboard. Solder paste is simultaneously or near simultaneously deposited on all the PCBs. Surface mount technology (SMT) components are picked and placed on all the PCBs. Performance of a process at the same time on all applicable items can be referred to as batch processing. In implementations, a middle PCB is placed on the populated bottom PCB and a populated top PCB is placed on the middle PCB. In implementations, daughter PCBs are placed on the motherboard PCB. The stacked PCBs with SMT components are simultaneously subjected to a reflow process. In an implementation, optical inspections may be performed after certain processes. The single assembly setup described herein improves overall product assembly cycle-time.

FIGS. 1A-D are photographs of a bottom printed circuit board (PCB) 100, a middle PCB 120, a top PCB 140, and a stacked assembly 160 in accordance with certain implementations. The photographs of the PCBs are illustrative and other types of substrates which contain traces (or lines) and pads to connect points may be used. In an implementation, the illustrative PCBs are of similar size and shape to allow for stacking in accordance with the methods described herein.

FIGS. 2A-D are example photographs of a bottom PCB panel 200, a middle PCB panel 220, the middle PCB panel 220 stacked on the bottom PCB 200, a top PCB panel 240 stacked on the middle PCB panel 220 (which was previously stacked on the bottom PCB panel 200) in accordance with certain implementations. In an implementation, each of the panels may include multiple PCBs as illustrated in FIGS. 1A-C.

Figure 3:
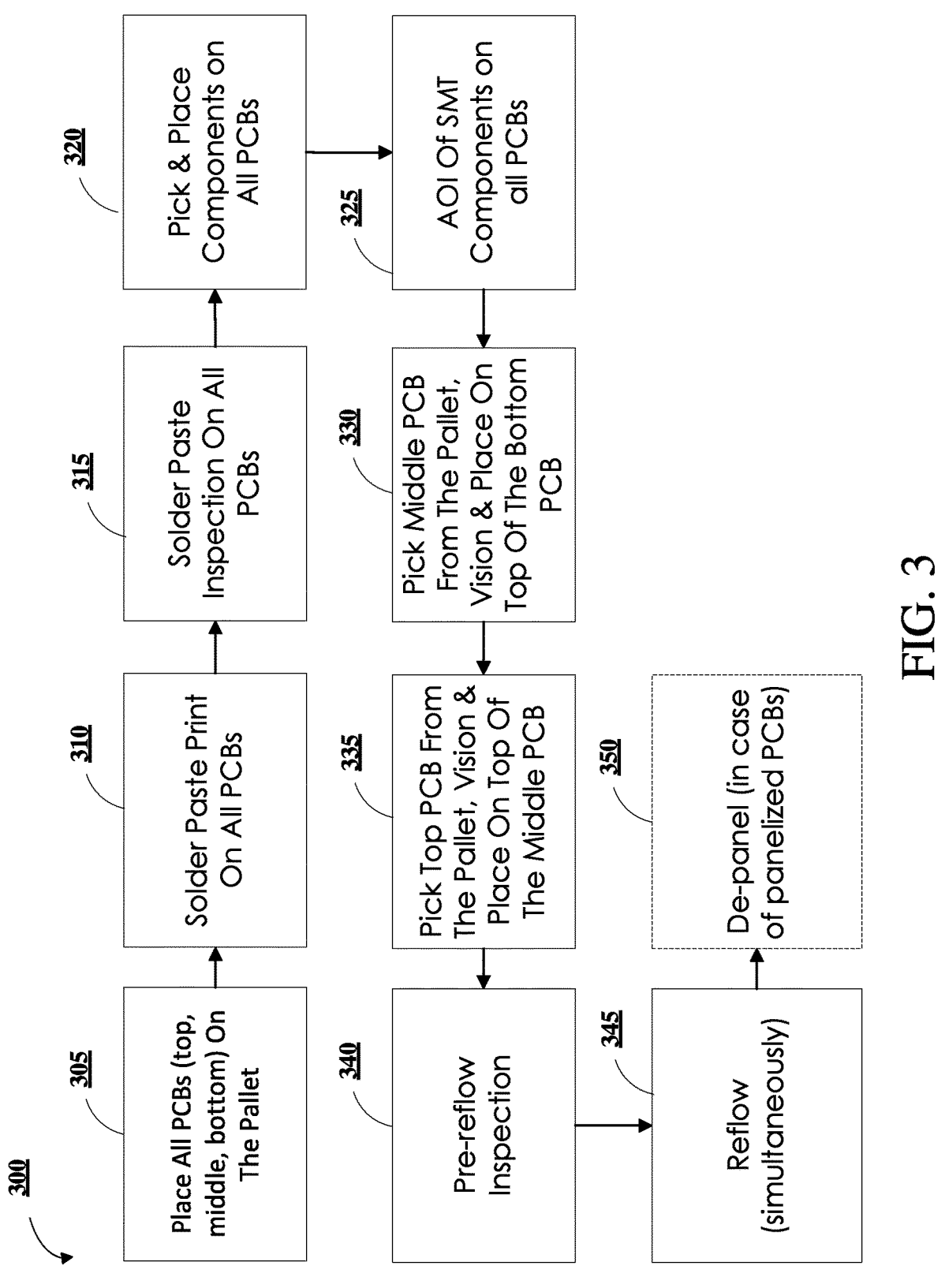
FIG. 3 is a flow diagram of a process for PCB assembly (PCBA) stacking with a single reflow in accordance with certain implementations.

FIG. 3 is a flow diagram of a process 300 for PCBA stacking with a single reflow in accordance with certain implementations. Although three PCBs are used in the illustrative example, the number of middle PCBS may vary depending on application and the like. The process 300 can include placing all PCBs, top, middle(s), and bottom, on a pick and place pallet in contrast to a feeder bank (305). After placement on the pallet, the process 300 can include depositing solder paste on the bottom PCB such as bottom PCB 100 or bottom PCB panel 200, for example, the middle PCB such as the middle PCB 120 or middle PCB panel 220, for example, and the top PCB such as the top PCB 140 or top PCB panel 240, for example (310). In an implementation, the solder paste may be printed on all the PCBs. In an implementation, the solder paste may be printed on all the PCBs using a stencil(s). The deposition techniques are illustrative and other deposition techniques may be used. The process 300 can then include inspecting the solder paste deposited on the bottom PCB for proper solder paste deposition (315).

After solder paste inspection of all the PCBs, the process 300 can include picking and placing surface mount technology (SMT) components on each of the bottom PCB, middle PCB(s), and top PCBs (320) (i.e. picking and placing an un-reflowed top PCB on a stack of at least one un-reflowed middle PCB and the un-reflowed bottom PCB to form the stacked assembly which are ready to be reflowed to form a stacked PCBA). The process 300 can then include inspecting the placement of the SMT components on the solder paste on the bottom PCB, middle PCB(s), and top PCB (325). In an implementation, automated optical inspection (AOI) may be used for inspecting the SMT components to check for catastrophic failure (e.g. a missing component), quality defects and other parameters or characteristics. After inspection, the process 300 can include picking, seeing and placing a middle PCB on the bottom PCB (330). In implementations, the process 330 can be repeated for multiple middle PCBs. After placing the middle PCB(s), the process 300 can include picking, seeing and placing a top PCB on the middle PCB (335).

After stacking the PCBs, the process 300 can include a pre-reflow inspection to check for proper placement of the PCBs, SMT component placement, and like issues (340). In an implementation, AOI may be used for inspecting the SMT components to check for catastrophic failure (e.g. a missing component), quality defects and other parameters or characteristics, and proper placement of each PCB. The process 300 can include reflowing the stacked assembly to melt the solder to create joints between pads, component leads and the multiple PCBs (345). The stacked assembly is therefore subjected to one reflow process, where the solder simultaneously melts or nearly simultaneously melts in one reflow process. In implementations where PCB panels are used, the process 300 can include depaneling the stacked assembled PCB panels to form stacked PCBs (350).

Figure 4:
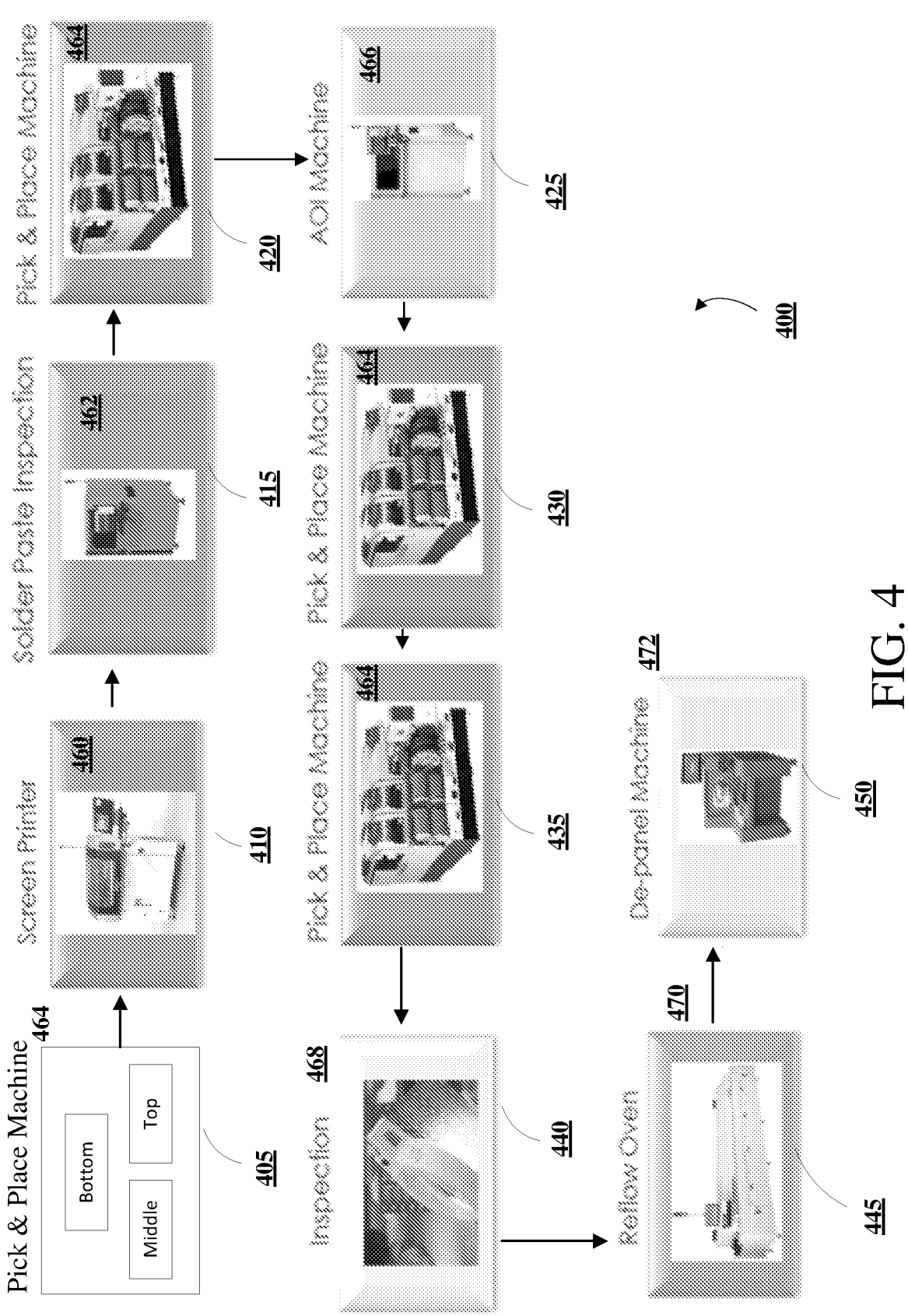
FIG. 4 is a flow diagram of a process with associated devices for PCBA stacking with a single reflow as described in FIG. 3 in accordance with certain implementations.

FIG. 4 is a flow diagram of a process 400 with associated devices for PCBA stacking with a single reflow in accordance with certain implementations. Although three PCBs are used in the illustrative example, the number of middle PCBs may vary depending on application and the like. The process 400 can be implemented using a screen printer 460, an inspection device 462, a pick and place device 464, an AOI device 466, an inspection device 468, a reflow oven 470 and a depaneling device 472 when applicable. In an implementation, the inspection device 462, the inspection device 468 and the AOI device 466 can be one device.

The process 400 can include the pick and place device 464 placing all PCBs, including the bottom PCB, middle PCB (s), and the top PCB, on a pick and place pallet (405). After placement of the PCBs, the process 400 can include the screen printer 460 depositing solder paste on all the PCBs including the bottom PCB, the middle PCB(s), and the top PCB (410). In an implementation, the solder paste may be printed on the PCBs. In an implementation, the solder paste may be printed on the PCBs using a stencil. The deposition techniques are illustrative and other deposition techniques may be used. The process 400 may include the inspection device 462 inspecting the solder paste deposited on the PCBs for proper solder paste deposition (415).

After solder paste inspection of the PCBs, the process 400 can include the pick and place device 464 picking and placing SMT components on the PCBs to form a bottom PCBA, middle PCB(s), and top PCB (420). In an implementation, the pick and place device 464 may place the SMT components on the top of the bottom PCB, the middle PCB(s), and the top PCB. The process 400 can then include the AOI device 466 inspecting the placement of the SMT components on the solder paste on the bottom PCB, the middle PCB(s), and the top PCB (425). In an implementation, the AOI device 466 may be used for inspecting the SMT components to check for catastrophic failure (e.g. a missing component), quality defects and other parameters or characteristics.

Figure 5:
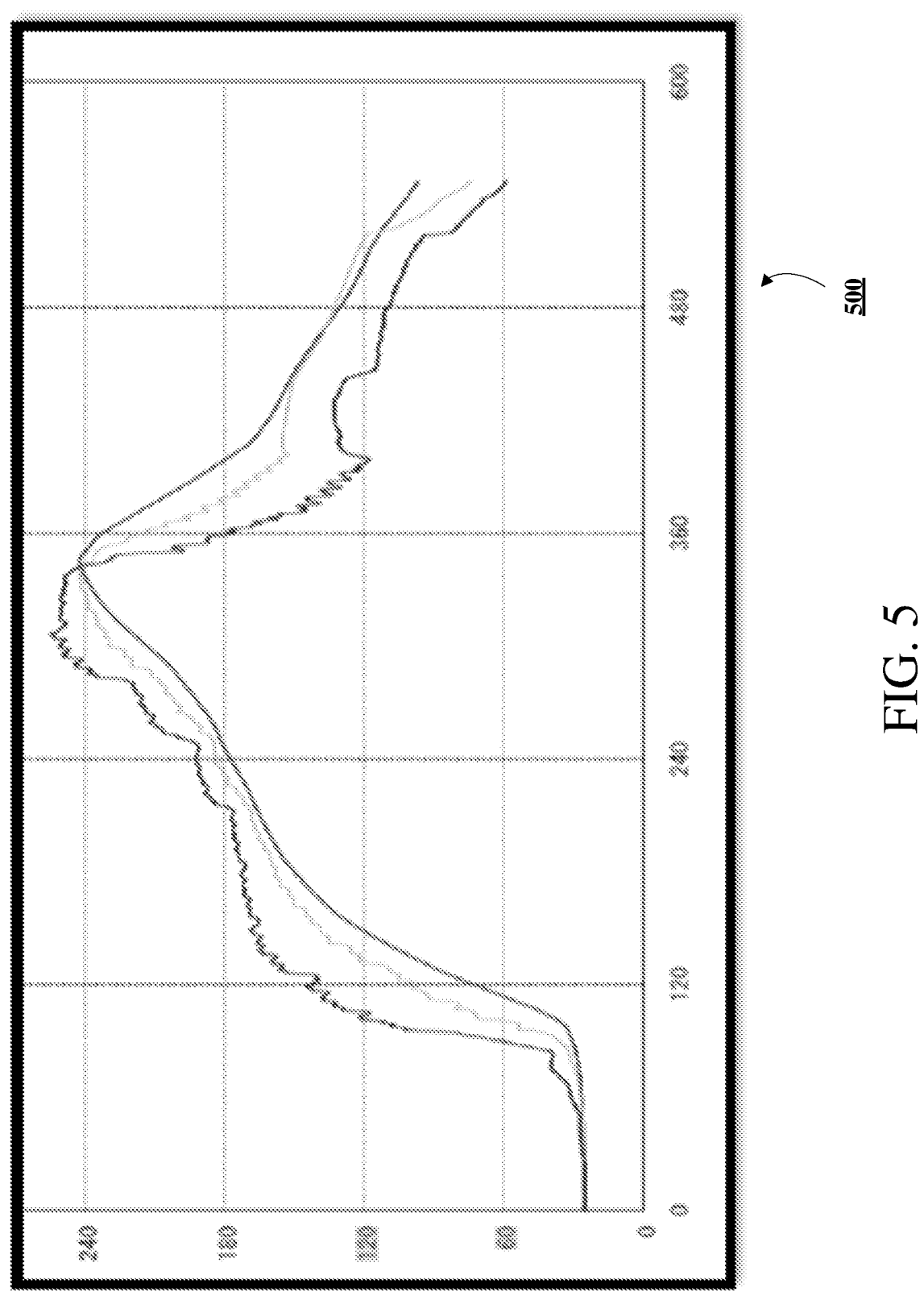
FIG. 5 is a graph of a temperature profile for PCBA stacking with a single reflow in accordance with certain implementations.

After inspection, the process 400 can then include the pick and place device 464 picking, seeing and placing a middle PCB on the bottom PCB (430). In implementations, this can be repeated for multiple middle PCBs. After middle PCB(s) placement, the pick and place device 464 picking, seeing and placing a top PCBA on the middle PCB (435). The process 400 can include the inspection device 468 pre-reflow inspecting the stacked assembly for SMT component and PCB placement (440). In an implementation, AOI may be used for inspecting the SMT components to check for catastrophic failure (e.g. a missing component), quality defects and other parameters or characteristics, and proper placement of each PCB. The process 400 can include using the reflow oven 470 for reflowing the stacked assembly to melt the solder to create joints between pads, component leads and the multiple PCBs (445). A temperature profile graph 500 for the reflow oven is shown in FIG. 5. In an implementation, the reflow profile may be a default starting point if recommendations or information is available from the solder paste supplier. In an implementation, a solder paste specification sheet may be used to determine the reflow profile. In an implementation, certain component requirements may require the assembler works at the upper or lower limits of the tolerances specified by the solder paste supplier. That is, both the temperature and the period at this temperature should be verified not to exceed the specifications of the components. In an implementation, the stacked assembly is placed in the reflow oven 470. The stacked assembly is therefore subjected to one reflow process, where the solder simultaneously melts or nearly simultaneously melts in one reflow process. In an implementation where PCB panels are used, the process 400 may include the depaneling device 472 for depaneling the stacked PCBA panels to form stacked PCBAs (450).

Figure 6:
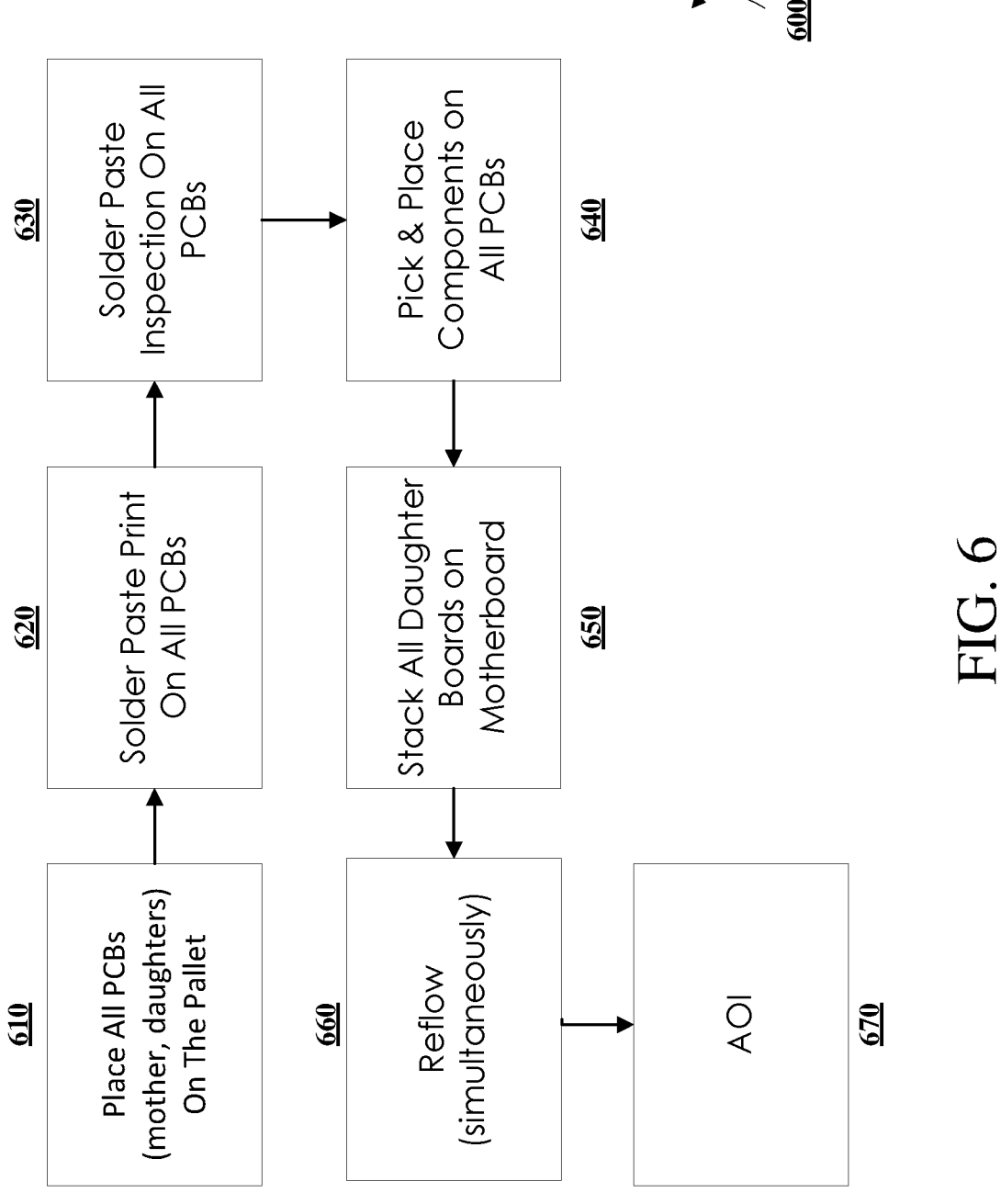
FIG. 6 is a flow diagram of a process for PCBA stacking with a single reflow in accordance with certain implementations.
Figure 7A:
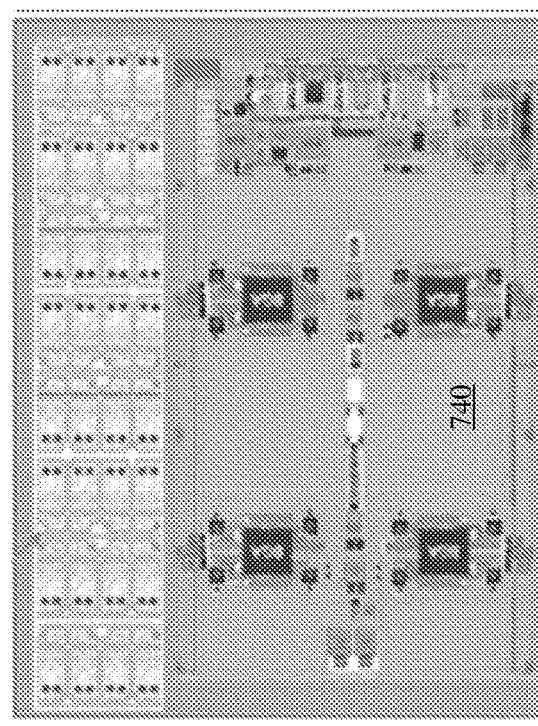
FIGS. 7A-C are photographs of daughterboard PCB panels and a motherboard PCB, the daughterboard PCB panels and the motherboard PCB with SMT components, and a stacked assembly in accordance with certain implementations.
Figure 7A:
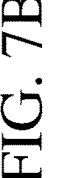
Figure 7B:
Figure 7C:
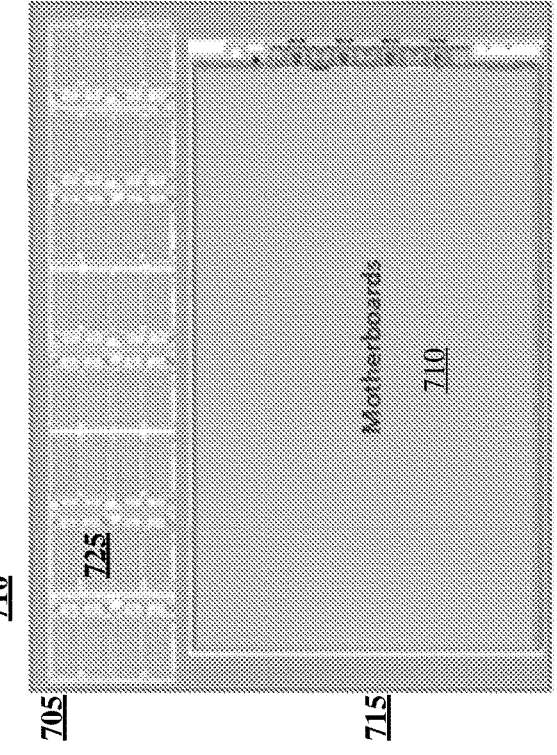
Figure 7C:
Figure 7C:
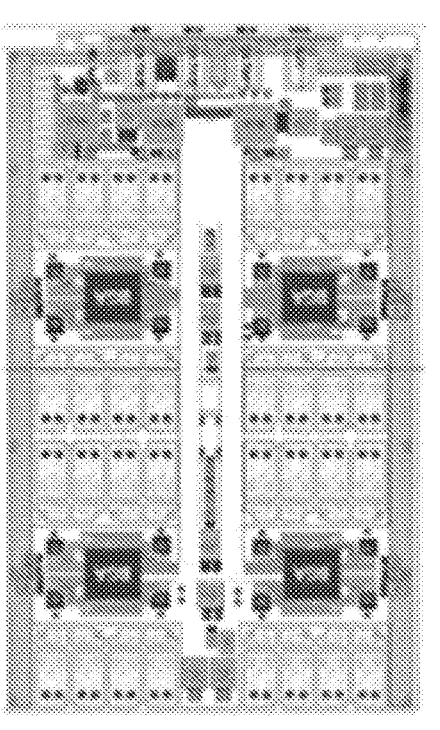

FIG. 6 is a flow diagram of a process 600 for PCBA stacking with a single reflow in accordance with certain implementations. FIG. 7A is a photograph of daughterboard PCB panels 705 and a motherboard PCB 710 on a pick and place pallet 715. Each daughterboard PCB panel 705 includes multiple daughterboard PCBs 725. FIG. 7B is a photograph of daughterboard PCB panels 730 and a motherboard PCB 740 with SMT components. FIG. 7C is a photograph of the populated daughterboard PCB panels placed on the populated motherboard PCB as a stacked board 750, and ready for the reflow process. In this instance, the motherboard is the bottom PCB or PCBA board (once reflowed).

Referring to FIG. 6 and FIGS. 7A-7C, the process 600 can include placing all PCBs or PCB panels, including daughterboard PCB panels 705 and the motherboard PCB 710 on a pick and place pallet in contrast to a feeder bank (610). In implementations, a pick and place device such as the pick and place device 464 can be used, for example. After placement on the pallet, the process 600 can include depositing solder paste on the daughterboard PCB panels 705 and the motherboard PCB 710 (620). In an implementation, the solder paste may be printed on all the daughterboard PCB panels 705 and the motherboard PCB 710 using a screen printer 460 as shown in FIG. 4. In an implementation, the solder paste may be printed on all the daughterboard PCB panels 705 and the motherboard PCB 710 using a stencil(s). The deposition techniques are illustrative and other deposition techniques may be used. The process 600 can then include inspecting the solder paste deposited on the daughterboard PCB panels 705 and the motherboard PCB 710 for proper solder paste deposition (630). In implementations, the inspection device 462 can be used.

After solder paste inspection of all the daughterboard PCB panels 705 and the motherboard PCB 710, the process 600 can include picking and placing surface mount technology (SMT) components on each of the daughterboard PCB panels 705 and the motherboard PCB 710 to form daughterboard PCB panels 730 and the motherboard PCB 740 (640). In implementations, the pick and place device such as the pick and place device 464 can be used, for example. In implementations, the process 600 can then include inspecting the placement of the SMT components on the solder paste on the daughterboard PCBA panels 730 and the motherboard PCB 740. In an implementation, an automated optical inspection (AOI) such as the AOI device 466 may be used for inspecting the SMT components to check for catastrophic failure (e.g. a missing component), quality defects and other parameters or characteristics.

After placement or inspection, the process 600 can include picking, seeing and placing each daughterboard PCB panel 730 on the motherboard PCB 740 to form a stacked board or assembly 750 (650). In implementations, the pick and place device such as the pick and place device 464 can be used, for example. In implementations, after stacking the PCBs, the process 600 can include a pre-reflow inspection to check for proper placement of the PCBs, SMT component placement, and like issues. In an implementation, an AOI device such AOI device 466 can be used for inspecting the SMT components to check for catastrophic failure (e.g. a missing component), quality defects and other parameters or characteristics, and proper placement of each daughter board PCB panel.

The process 600 can include reflowing the stacked assembly 750 to melt the solder to create joints between pads, component leads and the multiple PCBs (660). The stacked assembly 750 is therefore subjected to one reflow process, where the solder simultaneously melts or nearly simultaneously melts in one reflow process. In implementations where PCBA panels are used, the process 600 can include depaneling the stacked assembled PCBA panels to form stacked PCBAs subpanels as shown in FIG. 7A-C. After reflowing, the process 600 can include inspecting solder joints, placement, and the like. In an implementation, an AOI device such AOI device 466 can be used for inspecting.

Figure 8:
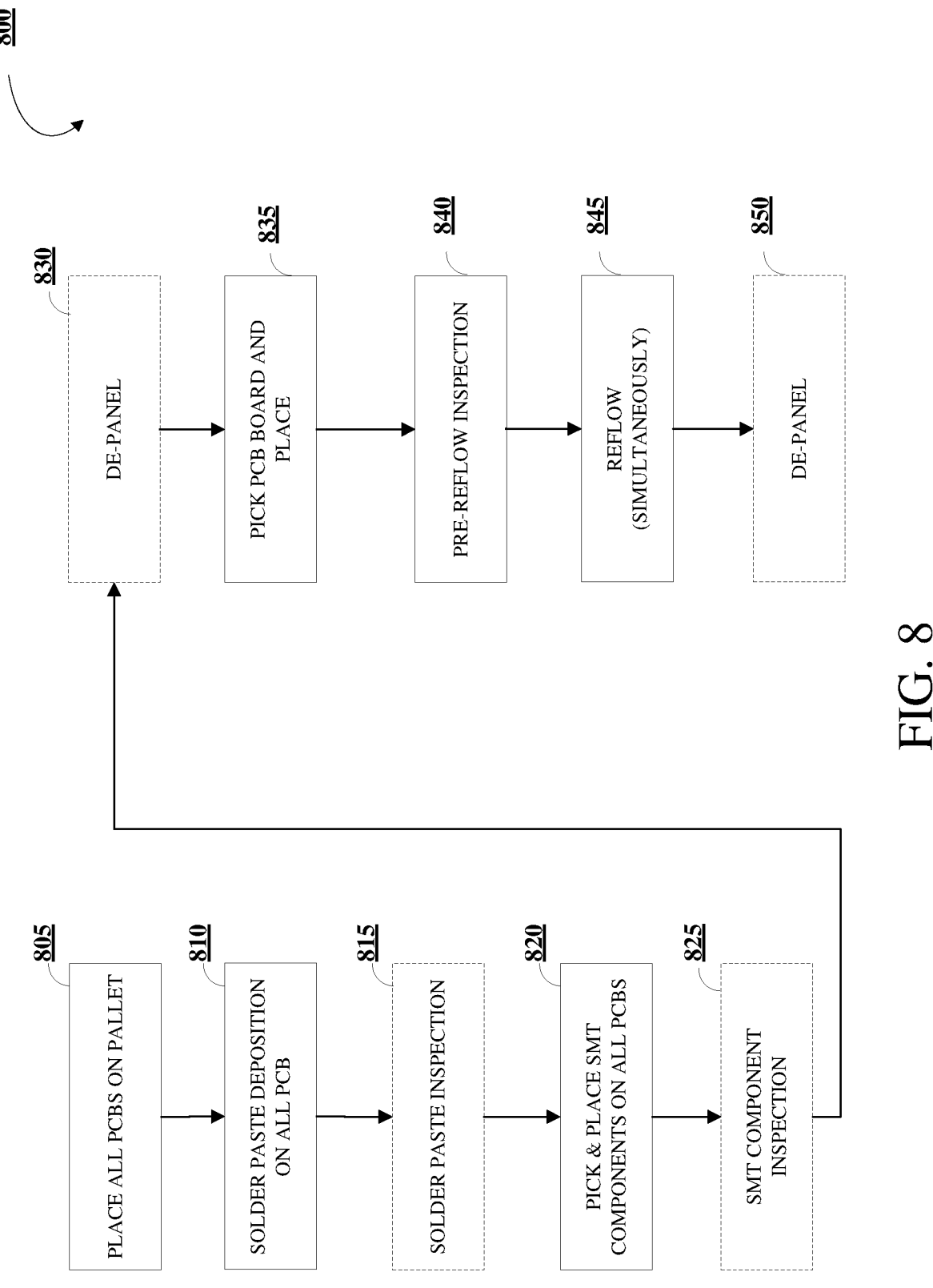
FIG. 8 is a flowchart of a process for PCBA stacking with a single reflow in accordance with certain implementations.

FIG. 8 is a flowchart of a method 800 for PCBA stacking with a single reflow in accordance with certain implementations. The method 800 includes: placing 805 all PCBs on a pallet; depositing 810 solder paste on all PCBs; inspecting 815 solder paste deposition (optional); picking and placing 820 SMT components on each PCB; inspecting 825 SIT placement (optional); depaneling 830 PCB panels into sub-panels when applicable (optional); picking and placing 835 PCBs into a stack(s); pre-reflow inspecting 840 the stacked assembly; reflowing 845 the stacked assembly; and depaneling 850 PCB panels into when applicable (optional).

The method 800 includes placing 805 all PCBs on a pick and place pallet. In implementations, a pick and place device can pick PCBs from a placement bed as opposed to a feeder back and place the PCBs on the pick and pallet for processing.

The method 800 includes depositing 810 solder paste on all PCBs. In implementations, solder paste deposition is done by screen printing. In an implementation, solder paste deposition is done by pin transfer. In an implementation, solder paste deposition is done by gang pin transfer. In an implementation, a pick and place device may be used for pin transfer and/or gang pin transfer. In an implementation, the solder paste is deposited on pads.

In implementations, the method 800 inspecting 815 solder paste deposition. In an implementation, an AOI device may be used to do the inspecting. Inspections can be done at one point or at multiple points in the processing of the PCBs, PCBAs, and the like.

The method 900 includes picking and placing 820 SMT components on each PCB. PCBAs are formed after placement of the SMT components. In an implementation, a pick and place device may be used for SMT component pick and placement.

In implementations, the method 800 inspecting 825 SMT component placement. In an implementation, an AOI device may be used to do the inspecting. Inspections can be done at one point or at multiple points in the processing of the PCBs, PCBAs, and the like.

In implementations, the method 800 depaneling 830 PCB panels into PCB sub-panels. For example, as shown in FIGS. 7A-C, sub-panels can be used without breaking a panel into individual PCB boards.

The method 800 includes picking and placing 835 a PCB on another PCB. In implementations, a middle PCB can be placed on a bottom PCB and a top PCB can be placed on the middle PCB. In implementations, multiple middle PCBs can be stacked together. In implementations, daughterboard PCB boards, daughterboard PCB sub-panels, and daughterboard PCB panels can be placed on the motherboard PCB as appropriate and applicable.

In implementations, the method includes 800 pre-reflow inspecting 840 the stacked assemblies. In an implementation, an AOI device may be used to do the inspecting. In implementations, the inspecting can include inspecting solder deposition, SMT component placement, and PCB placement.

The method 800 includes reflowing 845 the stacked assembly in a single reflow. The reflowing 845 simultaneously or nearly simultaneously melts the solder paste to form bonds or joint bonds between the SMT components and each of the PCB boards and between each of the respective PCB boards in one reflow process or operation. In an implementation, the reflowing 845 can include inspecting of the stacked assembly after reflow. In an implementation, an AOI may be used to do the inspecting.

In implementations, the method 800 includes depaneling 850 the reflowed stacked assembly to obtain PCB boards when PCB panels are used.

The construction and arrangement of the methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials and components, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

Although the figures may show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule-based logic and other logic to accomplish the various connection steps, processing steps, comparison steps, and decision steps.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for printed circuit board (PCB) assembly (PCBA) stacking with a single reflow comprising:
   placing top PCB, one or more middle PCBs, and a bottom PCB on a pick and place pallet;
   nearly simultaneously depositing solder paste on all the top PCB, the one or more middle PCBs, and the bottom PCB after placement of the top PCB, the one or more middle PCBs, and the bottom PCB on the pick and place pallet;
   picking and placing surface mount technology (SMT) components on all the top PCB, the one or more middle PCBs, and the bottom PCB to form an un-reflowed top PCB, un-reflowed one or more middle PCBs, and an un-reflowed bottom PCB after nearly simultaneously deposition of the solder paste on the top PCB, the one or more middle PCBs, and the bottom PCB;
   picking and placing the un-reflowed top PCB and the un-reflowed one or more middle PCBs on the un-reflowed bottom PCB to form a stacked assembly after placement of the SMT components on all the top PCB, the one or more middle PCBs, and the bottom PCB; and
   reflowing the stacked assembly in a single reflow to form a PCBA.

2. The method of claim 1, wherein the top PCB, the one or more middle PCBs, and the bottom PCB are a top PCB panel, one or more middle PCB panels, and a bottom PCB panel, the method further comprising:

depaneling the stacked assembly to form stacked assembly PCBs.

3. The method of claim 1, wherein after one or more of the nearly simultaneously depositing solder paste on all the top PCB, the one or more middle PCBs, and the bottom PCB, the picking and placing surface mount technology (SMT) components on all the top PCB, the one or more middle PCBs, and the bottom PCB, the picking and placing un-reflowed top PCB and the one or more middle PCBs on a bottom PCB to form a stacked assembly, or the reflowing the stacked assembly in a single reflow, the method further comprising:

inspecting one or more of solder paste deposition, PCB placement, and SMT components placement.

4. The method of claim 1, wherein one or more of the placing top PCB, one or more middle PCBs, and the bottom PCB on a pick and place pallet, the picking and placing surface mount technology (SMT) components on all the top PCB, the one or more middle PCBs, and a bottom PCB or the picking and placing the un-reflowed top PCB and the one or more middle PCBs on the un-reflowed bottom PCB to form a stacked assembly is performed using a pick and place machine.

5. The method of claim 1, wherein all solder paste simultaneously or nearly simultaneously melts to bond SMT components to respective PCBs and to bond respective PCBs to each other.

6. The method of claim 1, wherein the top PCB, the one or more middle PCBs, and the bottom PCB are PCB panels, the method further comprising:

depaneling the PCB panels to form PCB sub-panels.

7. The method of claim 1, the method further comprising:

picking and placing an un-reflowed top PCB on a stack of at least one un-reflowed middle PCB and the un-reflowed bottom PCB to form the stacked assembly which are ready to be reflowed to form a stacked PCBA.

8. A method for printed circuit board (PCB) assembly (PCBA) stacking with a single reflow comprising:

positioning a top PCB, one or more middle PCBs, and a motherboard PCB on a pick and place pallet;

simultaneously transferring solder paste on all the top PCB, the one or more middle PCBs, and the motherboard PCB after positioning the top PCB, the one or more middle PCBs, and the motherboard PCB on the pick and place pallet;

picking and placing surface mount technology (SMT) components on all the top PCB, the one or more middle PCBs, and the motherboard PCB to form an un-reflowed top PCB, un-reflowed one or more middle PCBs, and an un-reflowed motherboard PCB after simultaneously transferrin the solder paste on all the PCBs;

stacking the un-reflowed top PCB and the un-reflowed one or more middle PCBs on the un-reflowed motherboard PCBs to form an un-reflowed stack assembly after placement of the SMT components on all the top PCB, the one or more middle PCBs, and the motherboard PCB; and reflowing the un-reflowed stacked assembly in a single reflow to form a stacked PCBA.

9. The method of claim 8, wherein the PCBs are PCB panels, the method further comprising:

depaneling the stacked assembly to form stacked assembly PCBs.

10. The method of claim 8, wherein all solder paste simultaneously or nearly simultaneously melts to bond SMT components to respective PCB boards and to bond respective PCBs to each other.

11. The method of claim 8, the method further comprising:

inspecting one or more of solder paste deposition, PCB placement, and SMT components placement.

12. The method of claim 8, wherein the positioning, the picking and placing, and the stacking are performed using a pick and place machine.

13. The method of claim 8, wherein the PCBs are PCB panels, the method further comprising:

depaneling the PCB panels to form PCB sub-panels.

14. The method of claim 8, the method further comprising:

inspecting a reflowed stacked assembly.

15. The method of claim 8, the method further comprising:

inspecting PCB placement and SMT components placement using an automated optical inspection (AOI) device.

* * * * *